(12) United States Patent
Wei et al.

(10) Patent No.: US 8,841,917 B2
(45) Date of Patent: Sep. 23, 2014

(54) GROUND SCHEME IDENTIFICATION METHOD

(75) Inventors: Lixiang Wei, Whitefish Bay, WI (US); David W. Kirschnik, Germantown, WI (US); Richard A. Lukaszewski, New Berlin, WI (US); Gary L. Skibinski, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 755 days.

(21) Appl. No.: 13/077,212

(22) Filed: Mar. 31, 2011

(65) Prior Publication Data

US 2012/0249038 A1    Oct. 4, 2012

(51) Int. Cl.
*G01R 31/02* (2006.01)
*G01R 31/42* (2006.01)

(52) U.S. Cl.
CPC .............. *G01R 31/025* (2013.01); *G01R 31/42* (2013.01)
USPC .......................................... 324/509; 324/522

(58) Field of Classification Search
USPC .......................................... 324/509, 522, 525
See application file for complete search history.

(56) References Cited

U.S. PATENT DOCUMENTS

| 5,852,558 A * | 12/1998 | Julian et al. ................... 363/132 |
| 2011/0299308 A1* | 12/2011 | Cheng et al. ...................... 363/37 |
| 2012/0194202 A1* | 8/2012 | Xiao et al. ...................... 324/548 |

FOREIGN PATENT DOCUMENTS

CN    101071146    11/2007

OTHER PUBLICATIONS

Tallam et al; Publication entitled "Failure Mode for AC Drives on High Resistance Grounded Systems," IEEEk APEC 2006; Dallas, TX; Mar. 19-23, 2006; pp. 1587-1591.

* cited by examiner

*Primary Examiner* — Vincent Q Nguyen
(74) *Attorney, Agent, or Firm* — Fletcher Yoder P.C.

(57) ABSTRACT

The present techniques include methods and systems for detecting the grounding condition of an electrical system to automatically determine a suitable electrical drive configuration. The drive includes a test resistor which may be connected or disconnected from the drive to measure different drive voltages. The measured drive voltages are analyzed to determine a type of grounding configuration of the electrical system in which the drive is to be installed. Embodiments also include determining ground resistance condition such as a high resistance ground (HRG) fault or a ground resistance fault when the drive is in operation.

13 Claims, 10 Drawing Sheets

GROUND SCHEME IDENTIFICATION METHOD

BACKGROUND

The invention relates generally to the field of electrical drives. More particularly, the invention relates to techniques for detecting utility AC input grounding conditions for the drive.

Various power systems include power conversion systems such as electric drives and motors which are employed to convert electrical energy into mechanical energy. An electric drive includes a device or group of devices which controls the torque, speed, position, and/or performance of an electric motor. The drive is typically connected to a power source such as a battery, a power supply, or an AC generator, and controls the transmission of power from the power source to the motor, which converts the electrical power into mechanical power.

Electrical drives may be used for a wide range of industrial applications. For example, different types of electrical systems use electrical drives to drive power to various types of motors, such as AC induction motors, servomotors, DC motors, etc., which each perform different motions, such as rotary or linear motion under torque, velocity or position control, etc. The system configurations for such different applications and different mechanical functions may also vary greatly. For instance, different electrical systems may use different grounding configurations, such as solid grounded Y, solid grounded Δ (also referred to as corner grounded), high resist ground (HRG) grounded Y, or ungrounded, etc. The installation or configuration of an electrical drive is generally different depending on the grounding configuration of the system. An HRG system involves inserting a resistance between a neutral node and the ground of the input AC source of the system such that the system can operate under single ground faulted condition with a small non-destructive ground fault current.

Typically, improperly configuring an electrical drive according to the grounding configuration of the electrical system results in unexpected drive failure, as discussed in the Mar. 19-23, 2006 IEEE APEC article, Failure Mode for AC Drives on High Resistance Grounded Systems, by Rangarajan M. Tallam, et al. For example, HRG faults may result in high voltage levels in bus lines associated with the electrical drive and high voltage stresses in electrical drive components, which may eventually result in failures of the electrical drive or other system components. Moreover, HRG faults are typically difficult to detect once a drive is in operation, as the small amount of fundamental frequency ground current is difficult to measure in the presence of high frequency electronic noise created by the drive, especially in larger electrical drives. It is now recognized that techniques for reducing electrical drive configuration errors based on the grounding configuration of the electrical system may reduce such HRG fault conditions. The present techniques involve identifying a HRG system and other properties of the HRG system to determine the drive configuration.

BRIEF DESCRIPTION

The present invention relates generally to techniques for detecting the grounding condition of an electrical system to automatically determine a suitable electrical drive configuration. Embodiments include systems and methods of measuring drive voltages, and based on the measured drive voltages, determining the grounding configuration of the electrical system in which the drive is to be installed. Different embodiments include determining grounding configurations using a test resistor, a switch, and/or a contactor in the drive. Embodiments further include identifying a ground resistance fault condition during operation of the drive.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The present invention relates generally to techniques for detecting the grounding condition of an electrical system to automatically determine a suitable electrical drive configuration. Embodiments include systems and methods of measuring drive voltages to determine a type of grounding configuration. Embodiments also include identifying faults based on the high resistant grounding condition.

Figure 1:
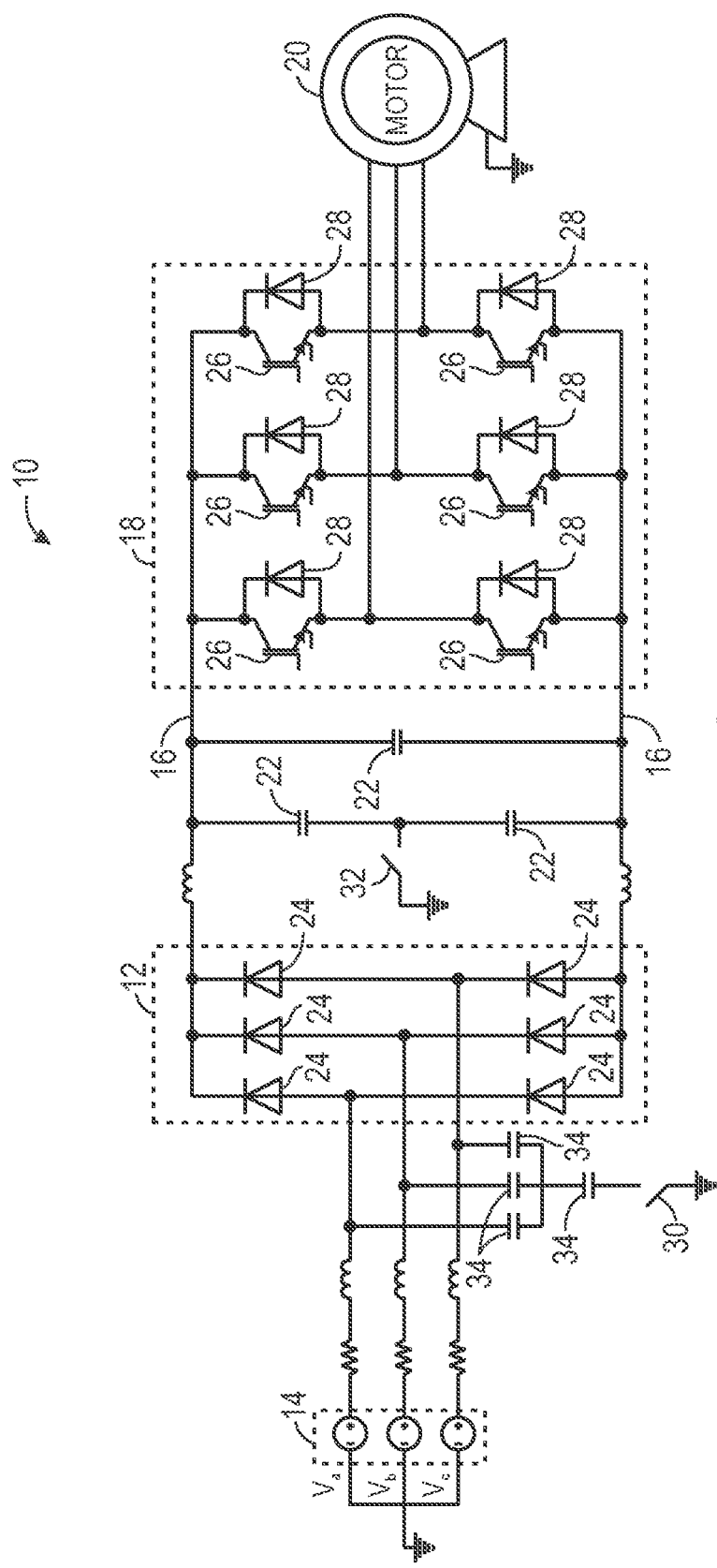
FIG. 1 is a circuit diagram of an application of an electrical drive system, in accordance with an embodiment of the present techniques.

Turning to the figures, FIG. 1 depicts an exemplary application of a drive system 10 which may be used in various electrical systems. The drive system 10, also referred to as the drive 10, includes a converter 12 configured to receive an AC voltage from one or more power sources 14 and to convert the AC voltage to DC voltage applied to a DC bus 16. The drive 10 also includes an inverter 18, which receives the DC voltage through the DC bus 16 and converts DC voltage from the DC bus 16 to output AC voltage at any desired frequency. A motor 20 connected to the inverter 18 is driven by the AC voltage which is supplied to the motor by the inverter 18. Depending on the electrical system in which the drive 10 is operating, different types of voltage may be needed to drive the motor 20. In one embodiment, the electrical drive system 10 also includes bus capacitors 22 configured to filter harmonics associated with the DC bus 16 and/or common mode capacitors (22a, 22b) used to filter the electrical switching noise generated by the drive system 10 through parasitic capacitances to ground.

In some embodiments, the converter 12 includes a 3×2 arrangement of thyristors 24 arranged in an integrated diode bridge configuration. The converter 12 may also be replaced with an arrangement of diodes, a rectifier bridge, or active control pulse width modulating (PWM) rectifiers which may be consistent with the 3×2 array of thyristors 24. The converter 12, also referred to as an rectifier 12, rectifies the incoming AC voltage to DC voltage in one direction to output a discretized output voltage waveform through the DC bus 16. The inverter 18 includes a 3×2 array of transistors 26 and power diodes 28, wherein each diode 28 is configured antiparallel to the respective transistor 26. The discretized output voltage from the DC bus 16 is switched by the transistors 26 which are configured to switch at a certain switching frequency to output voltages to the motor 20. While the illustrated embodiment depicts three-phase voltages (e.g., $v_a$, $v_b$, $v_c$), it should be noted that in different embodiments, the drive 10 may be suitable for inputting and outputting voltages of different phases (e.g., single phase voltage, two-phase voltages). The configurations of the converter 12 and inverter 18 may also be different, depending on the operating voltage(s) of the drive 10.

Traditionally, drive systems are used in a wide range of industrial applications, and the electrical systems for such different applications often use different grounding configurations, such as solid grounded Y, solid corner grounded, HRG grounded Y, or ungrounded, etc. Moreover, drive systems are used globally, and different countries may have different electrical requirements and standards. Due to the various electrical requirements and standards of different countries, the electrical systems used in these countries may have different grounding configurations. Accordingly, drive systems are typically configured to be suitable for a wide range of industrial applications and suitable for global use. However, the installation or configuration of a particular drive system is generally dependent on the grounding configuration used by the electrical systems in which the drive system is utilized. In the embodiment illustrated in FIG. 1, the drive system 10 includes multiple components such as jumpers 30, 32 and capacitors 34 which may be used in the drive 10 or removed from the drive 10, depending on the grounding configuration of the electrical system. The capacitors 34 may be configured to minimize drive electromagnetic interference to the grid generated by the drive. The jumpers 30, 32 represent any type of switching device or connecting device that may be switched closed or attached to a location in the drive 10, thereby grounding the drive 10 at the location, or switched open or detached from the drive 10, thereby not grounding the drive 10 at the location. For example, the jumper 30 may be removed from the drive 10 to ground the drive via the jumper 32. Alternatively, the jumper 32 may be removed from the drive 10 to ground the drive 10 via jumper 30. Both jumpers 30 and 32 are typically required to be removed under HRG systems to prevent drive components failures under grounded fault condition.

An improperly grounded drive may result in undesirable effects such as high resistance ground (HRG) faults. Such HRG faults are generally difficult to detect. HRG faults typically generate a relatively small amount of ground current which may be difficult to measure, especially in larger drives. However, the generated grounded current may result in high voltage levels in bus lines (e.g., DC bus 16) and high voltage stresses in the electrical drive components (e.g., the transistors 26) due to interaction of inverter [18] making and breaking the current into ground, which may eventually result in failures of the drive or failures in other components of the electrical system in which the drive is configured.

Embodiments of the present invention include systems and methods for determining a grounding condition (e.g., solid grounded Y, solid grounded A, HRG grounded Y, ungrounded) of an electrical system. In some embodiments, the identification of the system grounding configuration is indicated to a user. Further, based on the indicated grounding configuration, the user may remove various components (e.g., capacitors, jumpers) and/or configure an associated drive (e.g., drive 10) to be suitably grounded in the associated electrical system, thereby avoiding or decreasing the likelihood of HRG faults. It should be noted that, while the present techniques for detecting a grounding condition are described in connection with a motor drive (e.g., drive 10), the techniques are not limited to such applications. Rather, the same methodology may be utilized for determining grounding conditions in a wide range of circuit applications, particularly those in which a DC bus is used in conjunction with AC/DC rectification, DC/AC conversion, or conversion circuitry in general.

Different embodiments for determining a grounding condition of an electrical system are described below. The different embodiments include measuring drive voltages at different locations of the base drive 10 in accordance with present embodiments. It should be noted that the references to various embodiments of drives 10a, 10b, and 10c (as will be discussed in FIGS. 2, 8, and 9) generally include components of the base drive 10 (e.g., the converter 12, the voltage source 14, the DC bus 16, and the inverter 18). As will be discussed, different embodiments (e.g., drives 10a, 10b, and 10c) involve incorporating a test resistor at different locations of the base drive 10, using different elements (e.g., switch, contactor) to incorporate the test resistor, and/or measuring drive voltages from different locations of the base drive 10. Furthermore, as used herein, a drive 10 generally refers to any or all of the embodiments (e.g., drives 10a, 10b, and 10c) of the present techniques.

Figure 2:
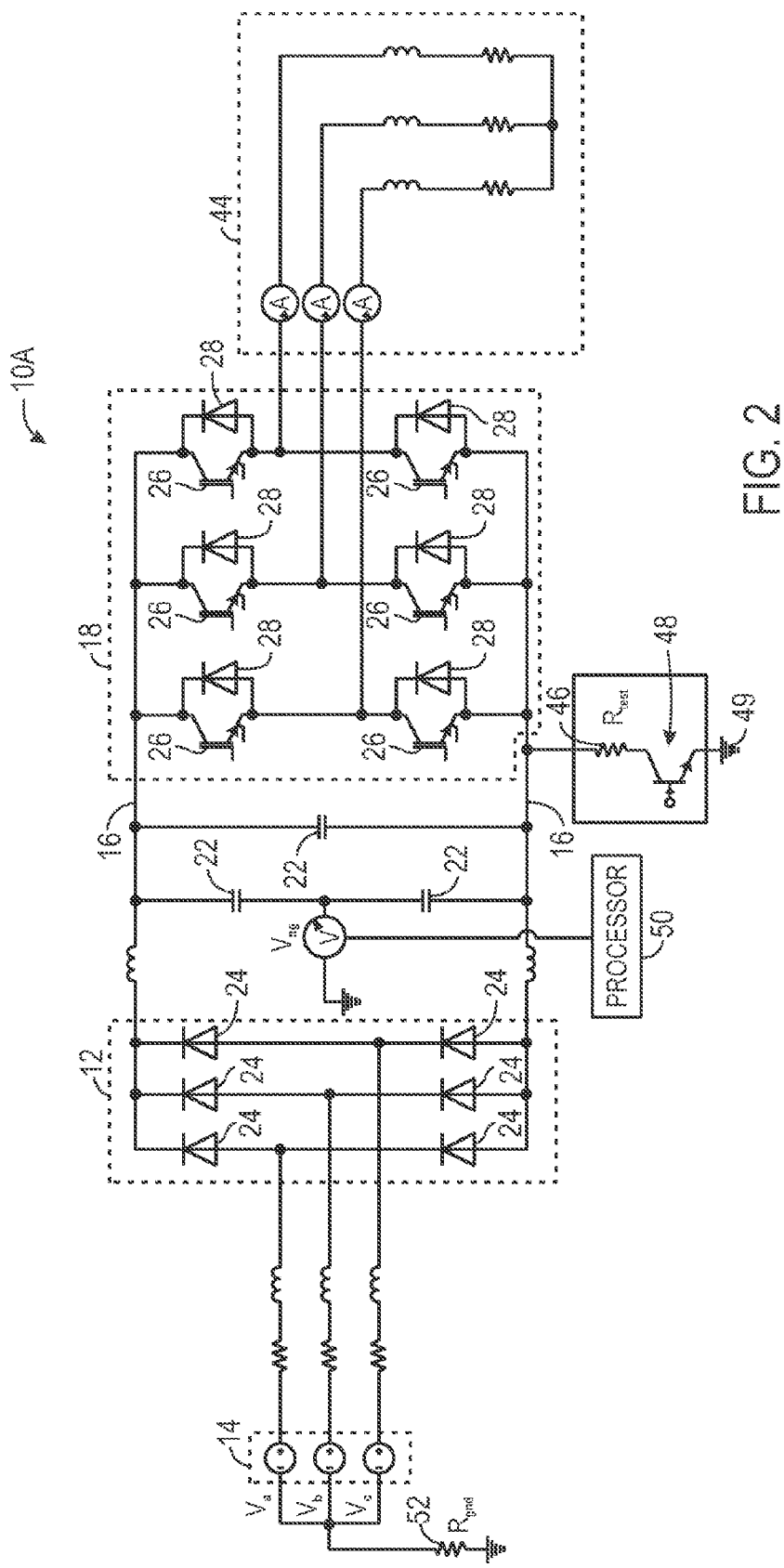
FIG. 2 is a circuit diagram of an electrical drive having a test resistor for determining a grounding configuration of an electrical system, in accordance with an embodiment of the present techniques.

One embodiment for determining a grounding configuration of an electrical system using a test resistor with a drive is illustrated in the circuit diagram of FIG. 2. As illustrated in FIG. 2, a drive 10a includes similar components to the base drive 10 discussed in FIG. 1, including the converter 12, the voltage source 14, the DC bus 16, and the inverter 18. Additionally, as illustrated in FIG. 2, the drive 10a is configured to supply AC power to a load 44. In other embodiments, the drive 10a may supply power to any type of load 44 or motor 20 (as in FIG. 1), or some combination of the motor 20 and the load 44, depending on the application for which the drive 10a is used.

In some embodiments, the grounding configuration of the electrical system may be tested by including a test resistor ($R_{test}$) 46 on the DC bus 16, between the converter 12 and the inverter 18. The test resistor 46 is coupled to a test switch 48 which may be switched closed to enable current flow through the test resistor 46 from the other circuitry of the drive 10a or switched open to prevent current flow through the test resistor 46. To determine the grounding configuration of the system, the neutral-to-ground voltage $V_{ng}$ is measured at node 42 while the test resistor 46 is switched open and switched closed. The node 42 is between a low side of the DC bus 16 and a ground potential 49. The measured $V_{ng}$ for the system with the test resistor 46 in opened and closed configurations is analyzed to determine the grounding configuration of the electrical system. For example, in one or more embodiments, the measured $V_{ng}$ may be analyzed by a processor 50 which determines various grounding conditions based on the measured $V_{ng}$. The resistance of the test resistor 46 is typically larger than the resistance of the effective resistance of the ground ($R_{gnd}$) 52 of the drive 10a and small enough to enable a path to ground such that the voltage at node 42 is measurable. For example, for HRG systems, $R_{gnd}$ 52 may be the effective neutral to ground resistor and may have a resistance of approximately 27Ω to approximately 277Ω for a system operating at 480V. For non-HRG systems, $R_{gnd}$ 52 may be an effective resistance representing the resistance of wires in the grounding system, and may generally be relatively low. For an ungrounded system, $R_{gnd}$ 52 may generally be relatively high. For example, in some embodiments, the resistance of the test resistor 46 may be greater than 277Ω (e.g., approximately 600Ω to approximately 1000Ω) for a 480V input voltage system. Such high resistances may reduce the likelihood of generating a HRG ground fault condition when the test resistor 46 is switched into the system. The different embodiments and different systems, the test resistance $R_{test}$ may be different and may depend on the voltages of different systems.

Figure 3:
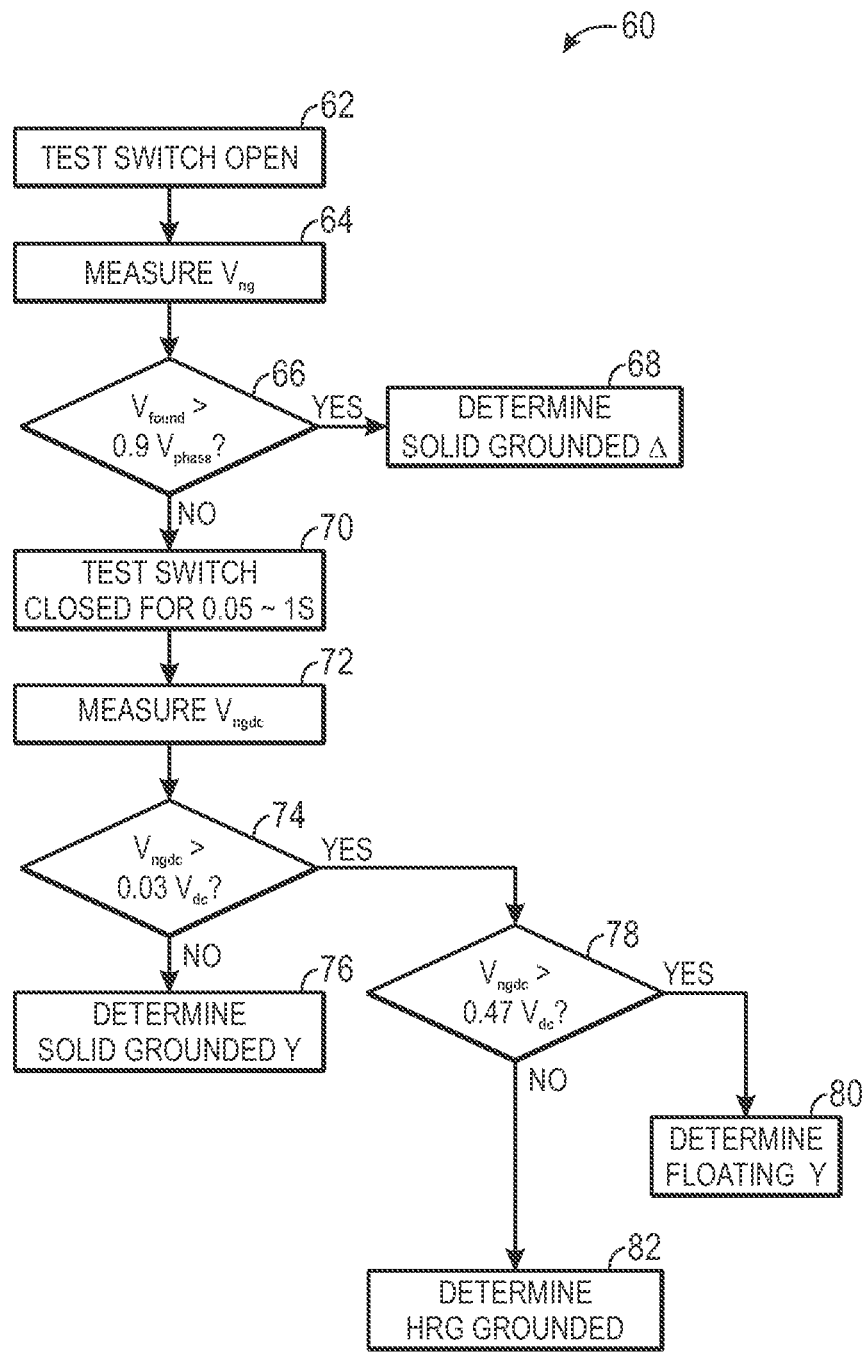
FIG. 3 is a flow chart summarizing a method for determining a grounding condition of the electrical system, in accordance with an embodiment of the present techniques.

One embodiment of a process 60 for determining the system grounding condition using the drive 10a of FIG. 2 is illustrated in the flow chart of FIG. 3. Certain steps or procedures of the process 60 are represented by blocks in the flow chart of FIG. 3. Additionally, corresponding voltage responses measured at the node 42 using the process 60 of FIG. 3 are provided in FIGS. 4-7. As such, FIGS. 3-7 will be explained together below.

Figure 4:
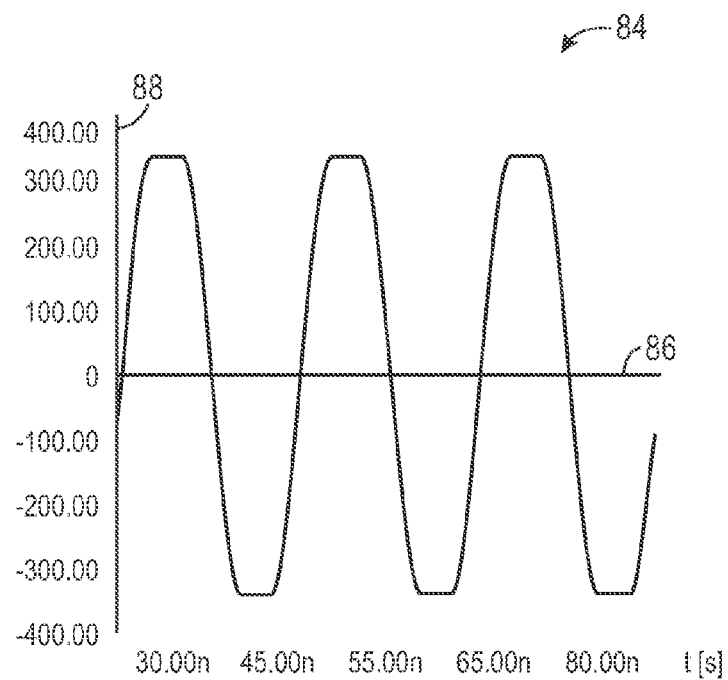
FIG. 4 is a plot representing a voltage characteristic when the electrical system is in a delta grounding condition, in accordance with an embodiment of the present techniques.

To test the grounding configuration of the electrical system, the drive 10a is powered (e.g., at the voltage source 14) in a manner such that the inverter 18 is not switching. As illustrated in FIG. 3, the process 60 begins with opening the test switch 48, as represented by block 62. When the test switch 48 is open, the neutral-to-ground voltage $V_{ng}$ is measured at node 42, as represented by block 64. The measured $V_{ng}$ represents the fundamental voltage ($V_{fund}$) of the drive 10a. As represented by block 66, the process 60 determines whether the fundamental frequency of the fundamental voltage $V_{fund}$ is approximately equal to the frequency of the phase voltage ($V_{phase}$) of the power supply 14. For example, in several countries (e.g., in North America), the frequency component of the phase voltage will be approximately 60 Hz. In some other countries (e.g., in Europe), the frequency of the phase voltage will be approximately 50 Hz. In some embodiments, a processor 50 performs a comparison, as represented by block 66. When the fundamental voltage $V_{fund}$ is substantially similar to the phase voltage $V_{phase}$ (e.g., greater than approximately 0.9*$V_{phase}$), the electrical system of the drive 10a is determined to be in a solid grounded Δ (also referred to as corner grounded) configuration, as represented by block 68. The processor 50 includes software suitable for comparing the fundamental voltage $V_{fund}$ to an appropriate $V_{phase}$ (e.g., depending on the country in which the drive 10a is being installed and/or depending on an input or measured phase voltage). The measured $V_{ng}$ for a solid grounded Δ configuration is illustrated in the plot 84 of FIG. 4. The plot 84 includes the $V_{ng}$ plotted with respect to time 86 and voltage 88. As illustrated in FIG. 4, $V_{ng}$ is relatively high (e.g., between approximately −331V to 331V) and similar to the voltage on the DC bus 16 (e.g., approximately 662V is the DC bus voltage used in this simulation) for 480V input system voltage, indicating a significantly high frequency component that is the same as that of the phase voltage (e.g., 60 Hz).

Figure 5:
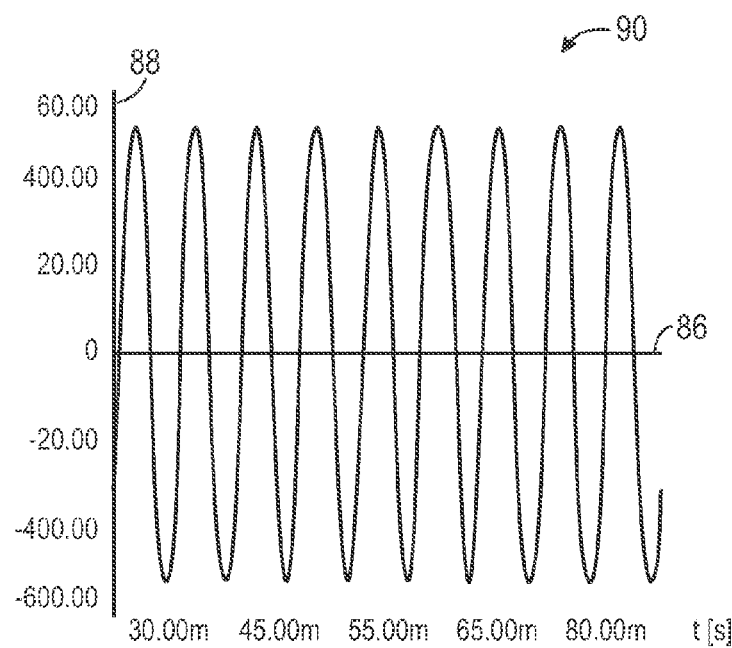
FIG. 5 is a plot representing a voltage characteristic when the electrical system is in a Y grounding condition, in accordance with an embodiment of the present techniques.
Figure 6:
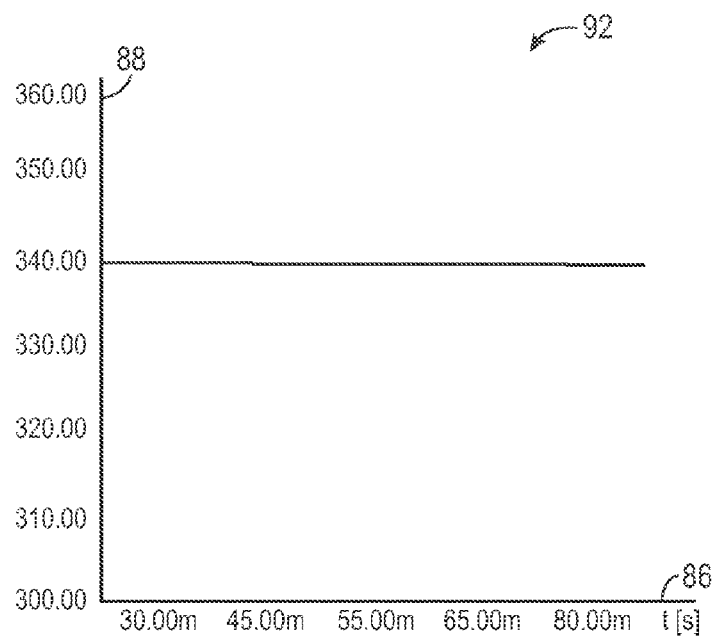
FIG. 6 is a plot representing a voltage condition when the electrical system is in an ungrounded condition, in accordance with an embodiment of the present techniques.
Figure 7:
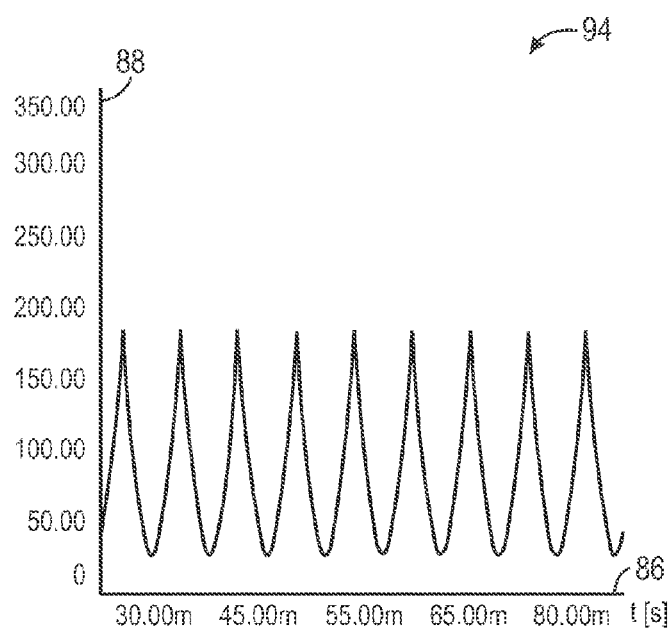
FIG. 7 is a plot representing a voltage condition when the electrical system is in a high resistance ground (HRG) condition, in accordance with an embodiment of the present techniques.

If the process 60 determines that $V_{fund}$ is not greater than approximately 0.9*$V_{phase}$, the system is determined not to be Δ grounded, and the process 60 then proceeds to block 70, which represents closing the test switch 48 for approximately 50 ms to approximately 1 s, thereby including the test resistor 46 in the drive system 10a during that time. The inclusion of the test resistor 46 results in a DC bias of $V_{ng}$. The DC bias of $V_{ng}$, represented as $V_{ngdc}$, is then measured, as represented by block 72. Further, the process 60 determines whether the DC bias $V_{ngdc}$ is significantly smaller than the voltage on the DC bus 16 ($V_{dc}$) of the drive 10a, as represented by block 74. For example, in one embodiment, the procedure represented by block 74 includes the processor 50 comparing $V_{ngdc}$ to approximately 0.03*$V_{dc}$. If $V_{ngdc}$ is smaller than 0.03*$V_{dc}$, the processor 50 determines, as represented by block 76, that the electrical system of the drive 10a is in a solid grounded Y configuration. One example of a measured $V_{ng}$ for a solid grounded Y configuration is illustrated in the plot 90 of FIG. 5. The plot 90 includes the $V_{ng}$ plotted with respect to time 86 and voltage 88. As illustrated in FIG. 5, $V_{ng}$ is relatively low (e.g., at approximately −50V to 50V), indicating a significantly low frequency component of the $V_{fund}$ that is the same as that of the phase voltage $V_{phase}$.

If $V_{ngdc}$ is determined to be larger than 0.03*$V_{dc}$ in block 74, the processor 50 determines, as represented by block 78, whether the DC bias $V_{ngdc}$ is larger than approximately half of the DC bus voltage $V_{dc}$ (e.g., ½ $V_{dc}$ is 331V). Such a large DC bias generally indicates that the system is floating and not connected to ground. In some embodiments, the processor 50 determines, as represented by block 78, whether $V_{ngdc}$ is greater than 0.47*$V_{dc}$ (e.g., approximately half the DC bus voltage $V_{dc}$). If this condition is met, the processor 50 determines, as indicated by block 80, that the system of the drive 10a is in an ungrounded configuration. For example, the measured $V_{ng}$ for an ungrounded configuration is illustrated in the plot 92 of FIG. 6. Because the system is not grounded, the $V_{ng}$ of the drive 10a has no frequency component and appears in the plot 92 as a flat voltage line at approximately 340V, which is higher than ½ $V_{dc}$ at 331V.

In some embodiments, if the $V_{ngdc}$ is determined to be smaller than 0.47*$V_{dc}$ in block 78, the processor 50 determines, as represented by block 82, that the system of the drive 10a is in a HRG grounded configuration. The typical $V_{ng}$ voltage range for an HRG grounded system falls approximately between the limits below:

$$\frac{1}{2}V_{dc} \cdot \frac{27}{R_{test}+27} < V_{ngdc} < \frac{1}{2}V_{dc} \cdot \frac{277}{R_{test}+277} \quad \text{equation (1)}$$

where $R_{test}$ is approximately between 277Ω to 600Ω, as previously discussed. Selecting an $R_{test}$ of 600Ω, and using a $V_{dc}$ of 662V, the voltage range in a HRG grounded configuration would be approximately 28.5V to 180V. A plot 94 illustrating the $V_{ngdc}$ of the drive 10a when the system is HRG grounded is provided in FIG. 7, where the voltage is between approximately 30V to 180V and the grounding current is lower than 1 ampere, which is within the typical limits for an HRG system. In some embodiments, a typical grounding resistance for a 480V HRG system may be approximately 27Ω to approximately 277Ω and a typical grounding fault current range may be approximately 10 mA to 1 A.

Figure 8:
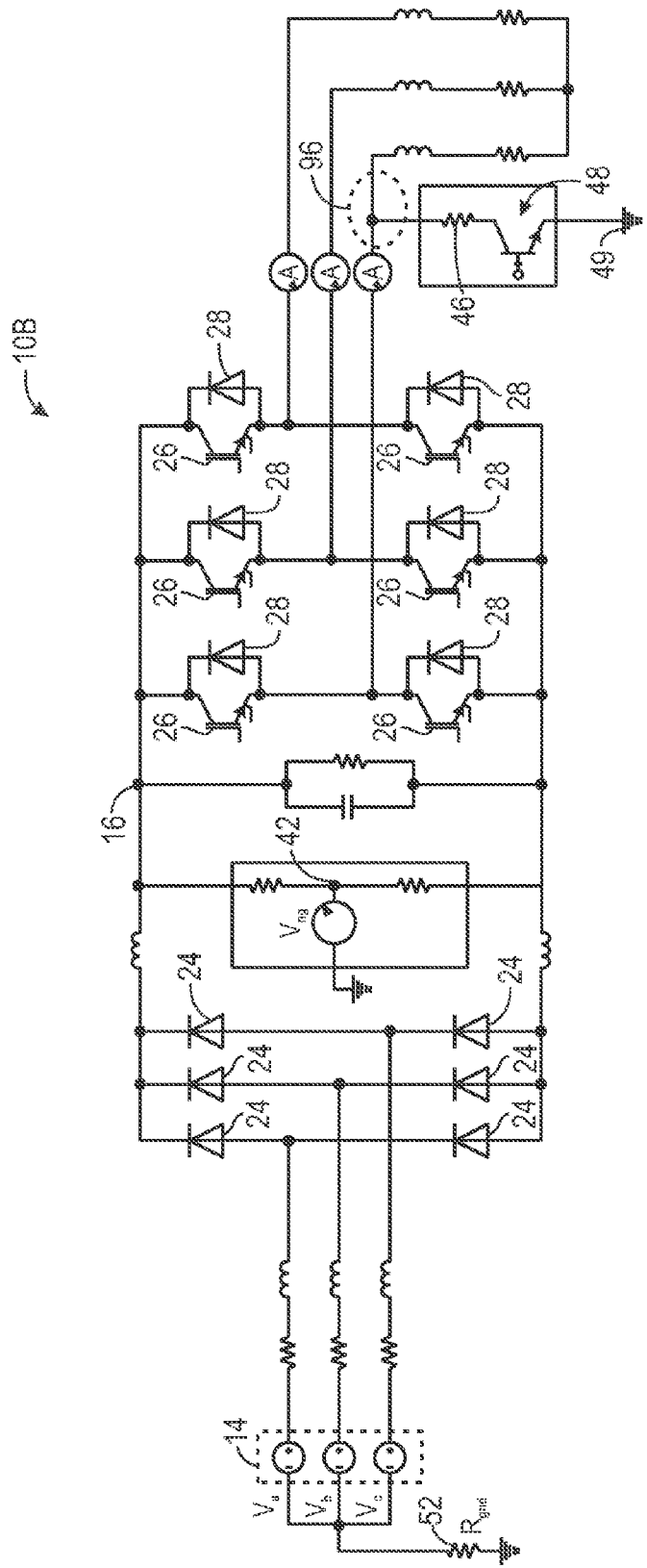
FIG. 8 is a circuit diagram of an electrical drive having a switch for determining a grounding configuration of an electrical system, in accordance with an embodiment of the present techniques.
Figure 9:
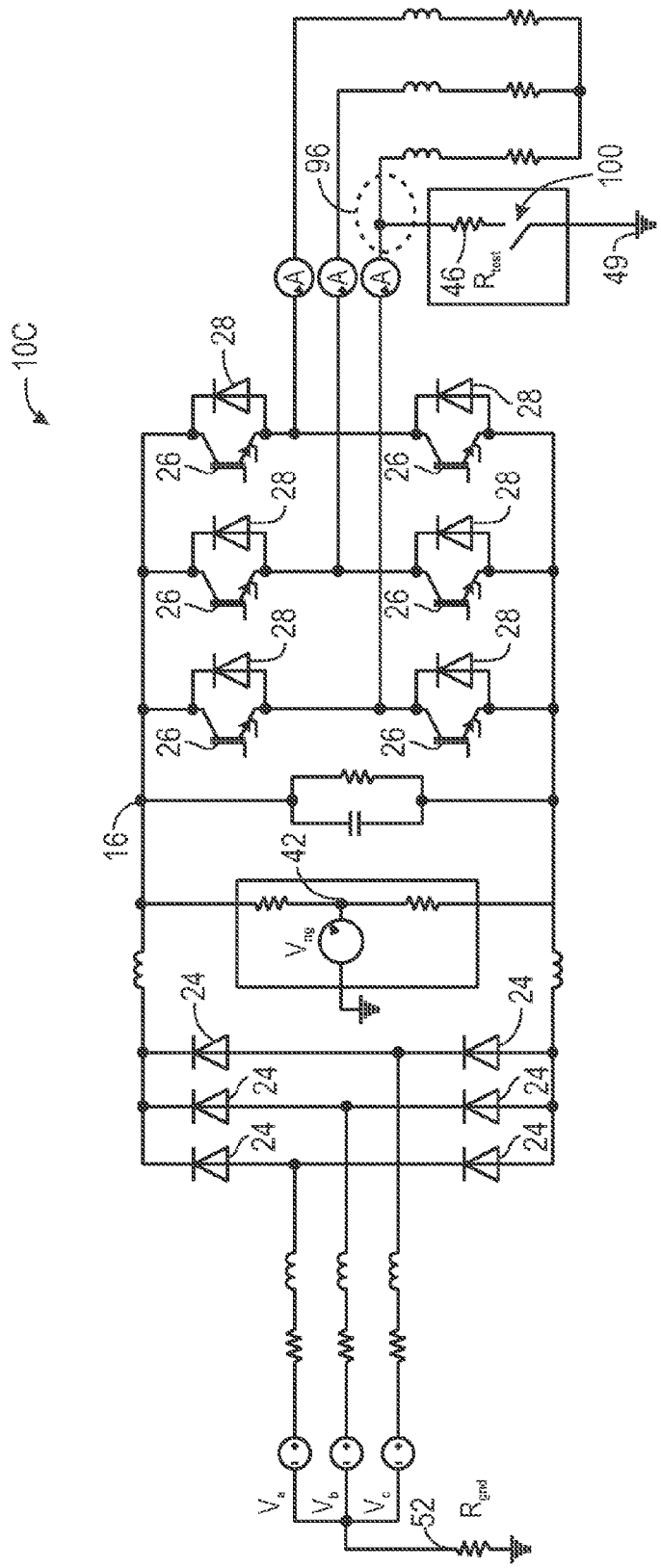
FIG. 9 is a circuit diagram of an electrical drive having a contactor for determining a grounding configuration of an electrical system, in accordance with an embodiment of the present techniques.

In other embodiments, the process 60 used to determine a grounding condition of the electrical system of the drive system 10a may also be used with different configurations of drives 10. For example, as illustrated in FIG. 8, the drive system 10b may be configured with the test resistor 46 and test switch 48 between the output phase at node 96 and a ground potential 49. Yet another embodiment for determining a grounding condition is illustrated in FIG. 9, where drive system 10c is configured with the test resistor 46 and a contactor 100. In some embodiments, the contactor 100 is employed to substantially isolate the test resistor 46 and other testing circuitry when the system 10a is not being tested. and the contactor 100 may not necessarily rely on a switching voltage to isolate the circuit (e.g., from a traditional switch 48, as in FIG. 8). To prevent the inverter 18 from switching during the process 60 in either of the embodiments in FIGS. 8 and 9, either all the lower transistors 26 or all of the upper transistors 26 may be shorted (e.g., by including a bus line between the DC bus 16 and the node 96).

In addition to determining the grounding configuration of the electrical system in which a drive 10 is installed, the present techniques are also applicable for identifying ground resistance faults. Ground resistance faults may refer to any fault associated with the ground resistor ($R_{gnd}$) 52. For example, if the temperature of $R_{gnd}$ 52 becomes too hot during operation of the drive 10, $R_{gnd}$ 52 may open, such that the drive is no longer grounded at the source 14. Furthermore, $R_{gnd}$ 52 may be shorted, or may otherwise not be properly connected to the neutral of the power source 14. One or more embodiments involve determining the status of the HRG grounding resistor $R_{gnd}$ 52, such as whether $R_{gnd}$ 52 is open or shorted. In some embodiments, determining the status of $R_{gnd}$ 52 may be performed before the drive begins to operate or after the drive begins to operate.

Figure 10:
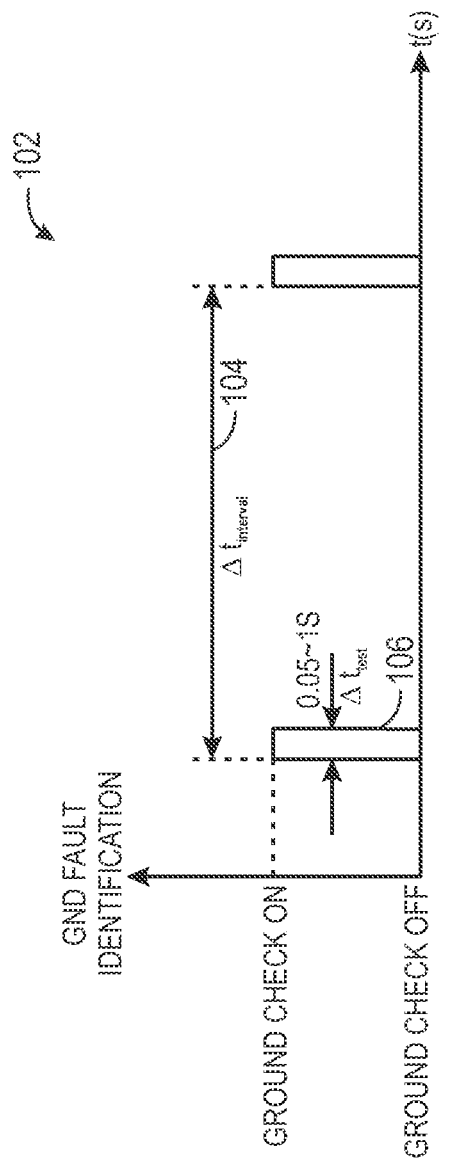
FIG. 10 is a timing diagram for identifying a ground resistance fault of the electrical drive in an HRG system, in accordance with an embodiment of the present techniques.

In some embodiments, the test resistor 46 in the drive 10 (e.g., as illustrated in drives 10a-c in FIGS. 2, 8, and 9) is used to periodically verify that $R_{gnd}$ 52 is properly connected between ground and the neutral of the power source 14 of the drive 10. In some embodiments, the test resistor 46 is used to determine if or when $R_{gnd}$ 52 is in fault. For example, in some embodiments, during the operation of the drive 10, the test resistor 46 is switched closed for a test duration (e.g., between approximately 0.05 s to 1 s) in regular time intervals (e.g., approximately every 3-4 hours). By testing the drive voltage at regular intervals during operation of the drive, faults which occur during drive operation may be detected. FIG. 10 illustrates a timing diagram 102 for identifying a ground resistance fault. At every test interval ($\Delta t_{interval}$) 104, the test switch 48 is closed for the test duration ($\Delta t_{duration}$) 106, and $V_{ng}$ is measured to analyze the ground resistance condition and determine whether a ground resistance fault has occurred.

Different embodiments involve different processes for analyzing $V_{ng}$, depending on the grounding condition of the system in which the drive is installed. A process for identifying ground resistance faults for drives installed in an HRG grounded system is provided in FIG. 11, and a process for identifying ground resistance faults for drives installed in systems having different grounding configurations (e.g., not HRG) is provided in FIG. 12. Each of the processes described in FIGS. 11 and 12 may occur substantially during and/or immediately after the closing of the test switch 48. Furthermore, either of the processes described with respect to FIGS. 11 and 12 may be performed by a processor 50, for example, or by any other suitable processing unit capable of analyzing $V_{ng}$ to determine ground resistance faults in various types of grounding configurations of the electrical system in which the drive 10 is operating.

Figure 11:
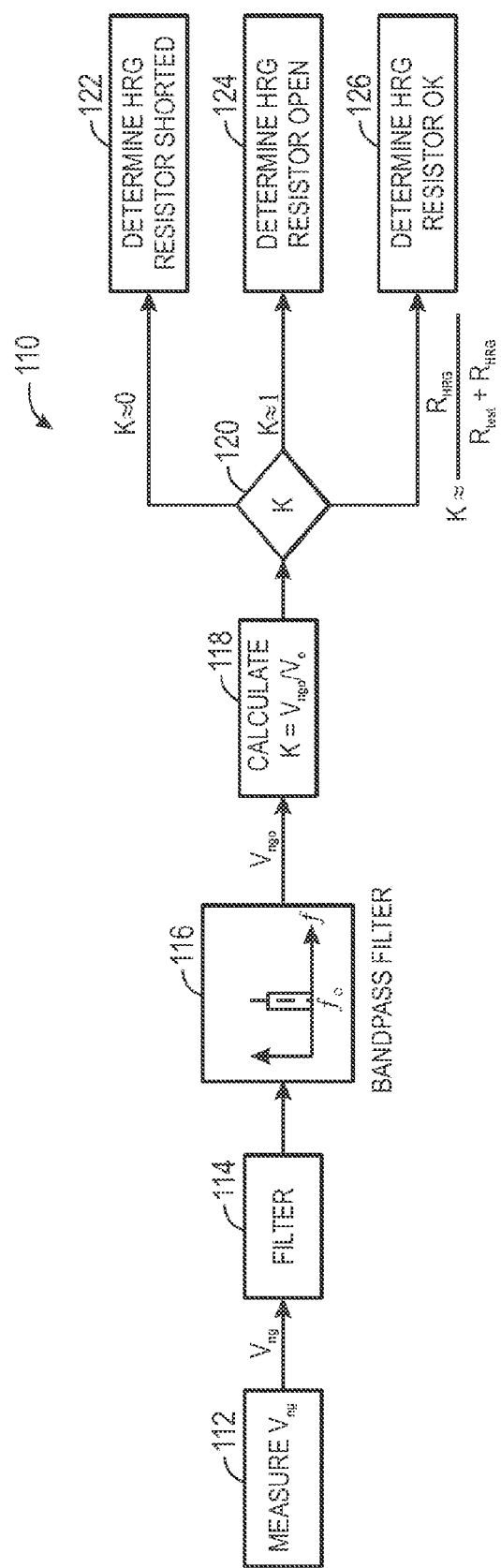
FIG. 11 is a flow chart of a method for identifying a ground resistance fault of an electrical drive in an HRG configuration, in accordance with an embodiment of the present techniques.

Beginning first with FIG. 11, the process 110 involves measuring the neutral-to-ground voltage $V_{ng}$ (e.g., at node 42 in FIGS. 2, 8, and 9), as represented by block 112, and filtering disturbances such as switching ripples from the $V_{ng}$, as represented by block 114. The $V_{ng}$ signal is also bandpass filtered to remove the frequency of the inverter 18, resulting in the $V_{ngo}$, as represented by block 116. The process 110 then involves calculating k=$V_{ngo}/V_o$, as represented by block 118, where $V_o$ represents the output voltage of the drive 10. As represented by block 120, when k is calculated, the process 110 determines that if k is approximately equal to zero, approximately equal to 1, or approximately equal to the relationship of equation (2) below:

$$k \approx \frac{R_{HRG}}{R_{test} + R_{HRG}} \quad \text{equation (2)}$$

If k is approximately equal to zero, the process 110 determines that the HRG resistor is shorted, as represented by block 122. If k is approximately equal to 1, the process 110 determines that the HRG resistor is open, as represented by block 124. Furthermore, if the process 110 determines that the relationship in equation (2) is met, the HRG resistor is determined to be operating normally, and no HRG fault is found to have occurred, as represented by block 126.

Figure 12:
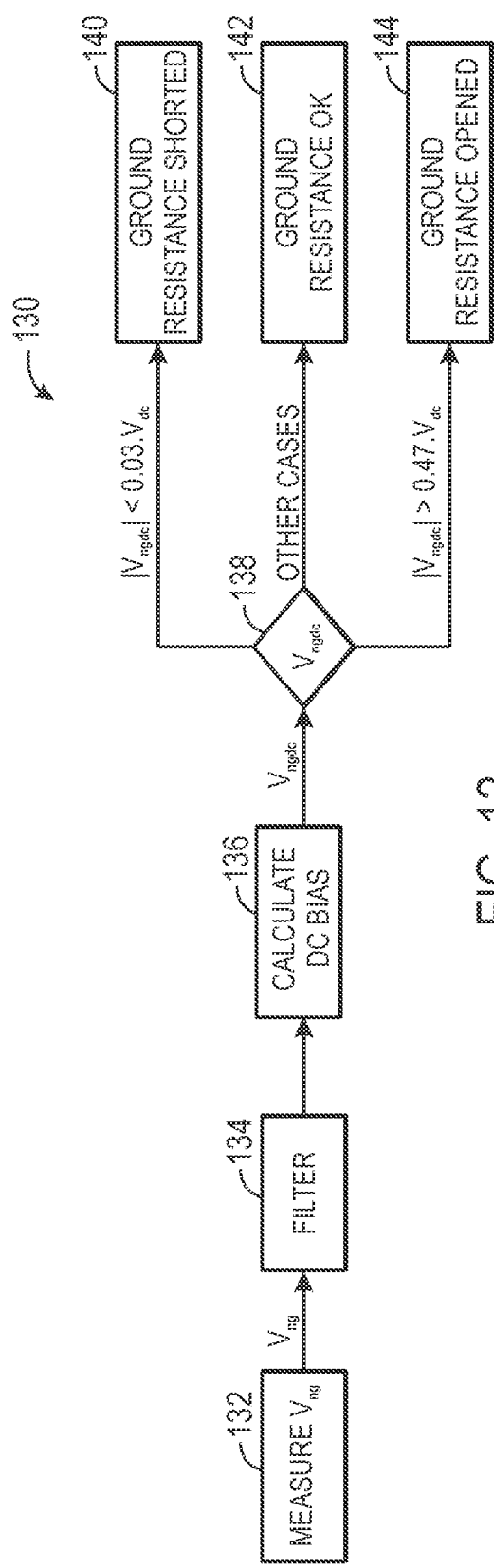
FIG. 12 is a flow chart of a method for identifying a ground resistance fault of an electrical drive that is not in an HRG configuration, in accordance with an embodiment of the present techniques.

FIG. 12 illustrates a process 130 suitable for identifying ground resistance faults for drives 10 installed in systems having other (not HRG) grounding configurations. The process 130 involves measuring the neutral-to-ground voltage $V_{ng}$ (e.g., at node 42 in FIGS. 2, 8, and 9), as represented by block 132, and filtering disturbances such as switching ripples from the $V_{ng}$, as represented by block 134. The DC bias ($V_{ngdc}$) of the neutral-to-ground voltage $V_{ng}$ is then calculated, as represented by block 136. The process 130 may determine whether the $V_{ngdc}$ meets various conditions, as represented by block 138. If $V_{ngdc}$ meets the condition in equation (3) below, the process 130 proceeds to block 140, which represents a determination that the $R_{gnd}$ 52 is shorted.

$$|V_{ngdc}| < 0.03 \cdot V_{dc} \quad \text{equation (3)}$$

If $V_{ngdc}$ meets the condition in equation (4) below, the process 130 determines that the $R_{gnd}$ 52 is open, as represented by block 144.

$$|V_{ngdc}| > 0.47 \cdot V_{dc} \quad \text{equation (4)}$$

Alternatively, if neither of the two conditions represented in equations (3) or (4) are met, the process 130 determines that $R_{gnd}$ 52 is operating normally, as represented by block 142, and that no ground resistance fault has occurred.

Therefore, in one or more embodiments, configuring a drive 10 with a test resistor 46 and analyzing the $V_{ng}$ under various conditions (e.g., opening or closing a switch 48 or contactor 100, according to the process 60 of FIG. 3) provides indication of the grounding configuration of the electrical system in which the drive 10 is to be installed. Furthermore, during operation of the drive 10, the same test resistor 46 may be used in the drive 10, and $V_{ng}$ may be measured to provide indication of a ground resistance condition (according to the processes 110 and 130 of FIGS. 11 and 12).

In one or more embodiments, the determined grounding configuration and/or ground resistance conditions are indicated or communicated to a user of the drive 10. The grounding configuration indication may also include instructions on how to properly configure the drive 10 in the electrical system. For example, an output of a ground identification test may instruct a user on how to configure the drive 10 (e.g., jumpers 30, 32 and capacitors 34, 22a, 22b may typically be removed when installing a drive 10 in an HRG system). In some embodiments, properly removing certain components may prevent high voltage stresses and/or component failures from occurring in HRG system.

It should be noted that though various reference values, such as $0.9*V_{phase}$, $0.03*V_{dc}$, and $0.47*V_{dc}$ are provided for determining the grounding configuration of a system, such reference values are only approximate and may be adjusted based on different tolerances in different drives 10 and/or systems. Moreover, as previously mentioned, the resistance values give (e.g., for $R_{gnd}$, $R_{test}$, etc.) are also approximate and may vary depending on the drive 10 and/or the system.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method, comprising:
   measuring a neutral-to-ground voltage at a node between a low side of a DC bus and a ground potential in a drive while the drive is coupled to an electrical system, wherein the drive comprises a power converter configured to convert AC power to DC power applied to the DC bus and an inverter configured to convert DC power from the DC bus to output AC power; and
   determining, via a processor, a grounding condition of the electrical system based on the neutral-to-ground voltage by determining the electrical system is in a solid grounded delta configuration when the neutral-to-ground voltage is substantially similar to a phase voltage of the drive.

2. The method of claim 1, further comprising providing an indication of the determined grounding condition of the electrical system.

3. The method of claim 1, further comprising providing drive installation instructions based on the determined grounding condition of the electrical system.

4. The method of claim 3, wherein the drive installation instructions comprises instructions to remove one or more components of the drive.

5. A method, comprising:
   measuring a neutral-to-ground voltage at a node between a low side of a DC bus and a ground potential in a drive while the drive is coupled to an electrical system, wherein the drive comprises a power converter configured to convert AC power to DC power applied to the DC bus and an inverter configured to convert DC power from the DC bus to output AC power;
   determining, via a processor, a grounding condition of the electrical system based on the neutral-to-ground voltage;
   connecting a test resistor in the drive; and
   measuring a DC bias of the neutral-to-ground voltage at the node, wherein the test resistor is connected either between the DC bus and a ground potential or between a load of the drive and the ground potential.

6. The method of claim 5, wherein connecting the test resistor in the drive comprises using a switch or a contactor configured to connect the test resistor to the drive while the DC bias of the neutral-to-ground voltage is measured.

7. A method, comprising:
   measuring a neutral-to-ground voltage at a node between a low side of a DC bus and a ground potential in a drive while the drive is coupled to an electrical system, wherein the drive comprises a power converter configured to convert AC power to DC power applied to the DC bus and an inverter configured to convert DC power from the DC bus to output AC power;
   determining, via a processor, a grounding condition of the electrical system based on the neutral-to-ground voltage;
   connecting a test resistor in the drive, wherein the test resistor is connected either between the DC bus and a ground potential or between a load of the drive and the ground potential; and
   measuring a DC bias of the neutral-to-ground voltage at the node;
   wherein determining the grounding condition of the electrical system comprises determining the electrical system is in a solid grounded Y configuration when the DC bias is substantially smaller than a DC voltage on the DC bus.

8. The method of claim 7, wherein the DC bias is substantially smaller than the DC voltage on the DC bus when the DC bias is less than 0.03 multiplied by the DC voltage.

9. The method of claim 7, wherein determining the grounding system of the electrical system comprises determining the electrical system is in an ungrounded configuration when the DC bias greater than or equal to approximately one half of the DC voltage on the DC bus.

10. The method of claim 7, wherein determining the grounding system of the electrical system comprises determining the electrical system is in a high resistance ground (HRG) configuration when the DC bias is smaller than approximately one half of the DC voltage on the DC bus.

11. A method, comprising:
    measuring a neutral-to-ground voltage at a node between a low side of a DC bus and a ground potential in a drive while the drive is coupled to an electrical system, wherein the drive comprises a power converter configured to convert AC power to DC power applied to the DC bus and an inverter configured to convert DC power from the DC bus to output AC power;
    determining, via a processor, a grounding condition of the electrical system based on the neutral-to-ground voltage;
    connecting a test resistor in the drive during a test duration, wherein the test resistor is connected either between the DC bus and a ground potential or between a load of the drive and the ground potential, and wherein the test duration occurs in regular time intervals while the drive is operating; and
    measuring the neutral-to-ground voltage at the node during the test duration; and
    determining a ground resistance condition based on the neutral-to-ground voltage measured during the test duration.

12. The method of claim 11, wherein determining the ground resistance condition comprises detecting a ground resistance fault or verifying a normal operation of the drive.

13. The method of claim 11, wherein the test duration is approximately 0.05 s to 1 s.

\* \* \* \* \*